United States Patent [19]

Wright et al.

[11] 4,271,005

[45] Jun. 2, 1981

[54] WORKPIECE SUPPORT APPARATUS FOR USE WITH CATHODE SPUTTERING DEVICES

[75] Inventors: Robert J. Wright, Tequesta; Ralph J. Hecht, North Palm Beach, both of Fla.

[73] Assignee: United Technologies Corporation, Hartford, Conn.

[21] Appl. No.: 99,246

[22] Filed: Dec. 3, 1979

[51] Int. Cl.³ .................................................. C23C 15/00
[52] U.S. Cl. .................................... 204/298; 118/728; 269/287
[58] Field of Search ............ 204/192 R, 298; 269/37, 269/46, 47, 287; 118/728

[56] References Cited
U.S. PATENT DOCUMENTS
4,090,941  5/1978  Wright et al. .................. 204/298

Primary Examiner—Delbert E. Gantz
Assistant Examiner—William Leader
Attorney, Agent, or Firm—Robert C. Walker

[57] ABSTRACT

Apparatus for mounting a workpiece to be coated in a cathode sputtering device is disclosed. Various construction details enable effective masking or shielding of a portion of the workpiece from coating deposition. In detailed form a box-like member circumscribes the platform of a blade or vane to be coated and encases the attachment section of the blade or vane.

5 Claims, 7 Drawing Figures

WORKPIECE SUPPORT APPARATUS FOR USE WITH CATHODE SPUTTERING DEVICES

DESCRIPTION

1. Technical Field

This invention relates to cathode sputtering devices, and more particularly to apparatus for mounting workpieces to be coated in such a device.

The concepts were developed in the gas turbine engine industry for the application of high quality coatings to airfoil and platform surfaces of rotor blades and stator vanes.

2. Background Art

Cathode sputtering is a process for depositing surface material on a substrate article. Deposition of the material on the article combines preferred properties of the coating material with preferred properties of the substrate material to produce a composite structure with enhanced capabilities.

In the practice of the cathode sputtering process, a coating material on a sacrificial cathode is bombarded by minute particles, causing a transfer of energy to the surface atoms of the coating material. The energized surface atoms eject from the sacrificial cathode into a sputtering chamber where a portion of the ejected atoms is intercepted by the substrate to be coated. The intercepted atoms impinge upon the surface of the substrate and become adhered thereto. The deposition is undirected and depends upon the random intercept of the ejected atoms by the article to be coated.

Sequenced depositions on the atomic scale over a period of time produce an even, well adhered film on the substrate. The deposition of high melting point materials, including even ceramics has been achieved. One apparatus in which the concepts of the present invention have high utility is disclosed in U.S. Pat. No. 4,090,941 entitled "Cathode Sputtering Apparatus" by Wright et al, of common assignee herewith.

Inasmuch as the cathode sputtering technique employs random intercept concepts, protection of areas of the articles to be free of coating material is required to free those areas from the impingement of coating particles. New apparatus and procedures capable of providing simple, yet effective protection of the areas to be free of coating are sought by designers and manufacturers in the field.

DISCLOSURE OF THE INVENTION

According to the present invention the attachment section of a blade or vane having airfoil and platform surfaces to be coated in a cathode sputtering device, is encased by a box-like structure through which a pin is insertable to secure the attachment section within the box-like structure.

According to one aspect of a more detailed embodiment of the invention, a plurality of such box-like structures for supporting rotor blades are disposed along a rod member with one or more of said box-like structures being rotatable about the rod to enable close assembly of the blades or vanes into the box-like structures along the rod.

A primary feature in one embodiment of the present invention is a clip which engages the attachment section of the blade or vane. The clip has a tubular portion into which a pin is insertable for holding the clip and attachment section secured thereto within the box-like structure. A feature of the more detailed embodiment of the invention is the plurality of box-like structures disposed along a single rod. One or more of the box-like structures are rotatable about the rod to provide access to the box-like members for insertion of the attachment sections. In detailed aspect the sides of the box-like structure are raised slightly above the platform of the workpiece to be coated and the sides of the box-like structure are spaced apart from the sides of the circumscribed platform to prevent the joining of the box-like member to the platform as a result of the coating build-up.

A principal advantage of the present invention is the effective support of blades and vanes within a cathode sputtering device provided thereby. The box-like structure in which the blades or vanes are supported further shields the attachment sections of the blade or vane from coating material to be deposited on the desired airfoil and platform surfaces. The blades and vanes are easily assembled and disassembled from the support and shielding apparatus. In the detailed embodiment of the invention, a plurality of blades or vanes can be closely supported on a single rod with axes in substantial vertical alignment. Such close assembly onto the support apparatus is enabled by the rotatable box-like members which can be swung out of alignment for assembly of the blades or vanes. In detailed embodiments, joining of the box-like structure to the circumscribed platform during the coating process is avoided by raising the walls of the box-like structure above the platform and by spacing the walls apart from the sides of the platform.

The foregoing features and advantages of the present invention will become more apparent in the light of the following drawing and of the description of the best mode contemplated for carrying out the invention.

BEST MODE FOR CARRYING OUT THE INVENTION

Figure 1:
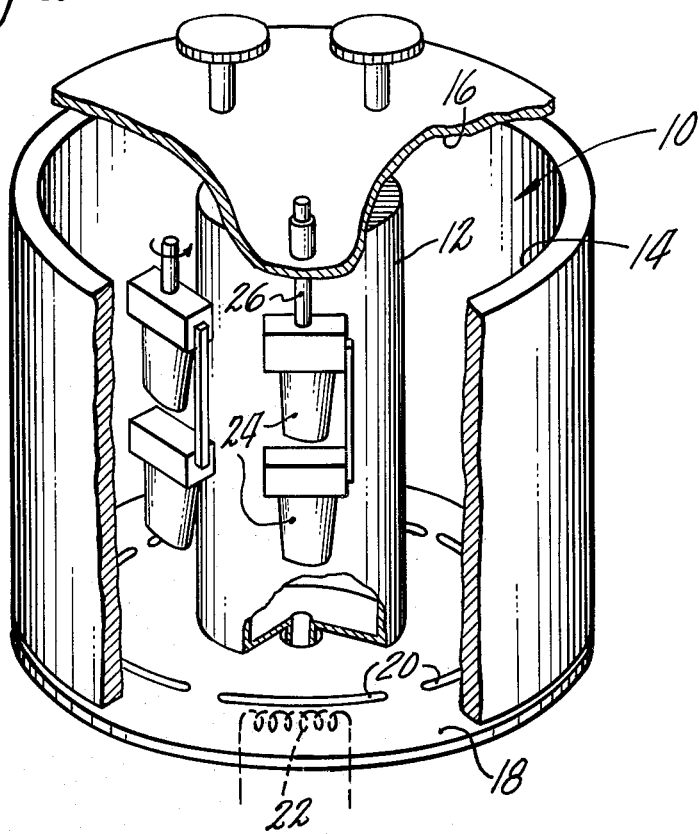
FIG. 1 is a simplified representation of a cathode sputtering device capable of employing the concepts of the present invention.

The concepts of the present invention have significant utility in the cathode sputtering device illustrated by the FIG. 1 simplified view. The apparatus illustrated is known as a triode sputtering system. A sputtering chamber 10 is formed between a center, post cathode 12 and a hollow, cylindrical cathode 14. An anode plate 16 is disposed at one end of the chamber 10 and a ground plate 18 having a plurality of apertures 20 is disposed at the opposing end of the chamber. An electron source such as a filament 22 of the type adapted for the thermionic emission of electrons is disposed behind the ground plate. Substrate articles, or workpieces 24 are suspended within the sputtering chamber 10 on a first, rod-like member 26 which penetrates the anode plate 16. The substrate articles are electrically insulated from the anode plate and from the cathodes.

During operation of the apparatus the sputtering chamber is filled with an inert gas such as argon. Electrons emitted by the filament 22 are drawn into the sputtering chamber 10 by the anode plate 16 through the apertures 20 and the group plate 18. A portion of the emitted electrons strike atoms of the argon gas within the chamber and cause the secondary emission of one or more electrons from the impacted argon atoms. Positively charged argon ions are resultantly formed. The positively charged ions are electrically drawn to the post cathode and the cylindrical cathode where the ions impart kinetic energy to the surface atoms of the cathode material. Energized cathode atoms sputter from the surface of the cathode into the chamber 10. A converging flux of coating material eminates from the hollow cathode and a diverging flux of coating material eminates from the post cathode. A portion of the sputtered atoms impinge upon and adhere to the substrate article to be coated. The repeated incidence of cathode atoms on the surface of the substrate forms the desired coating thereon.

In its basic form the depth of coating is a function of the exposure period within the chamber and the intensity of the atom flux. Typical coating depths of approximately five thousandths of an inch (0.005 in.) are obtainable in an eight hour coating cycle. Further description of sputter coating apparatus and methods of deposition are disclosed in the U.S. Pat. No. 4,090,941 hereinbefore cited.

Figure 2:
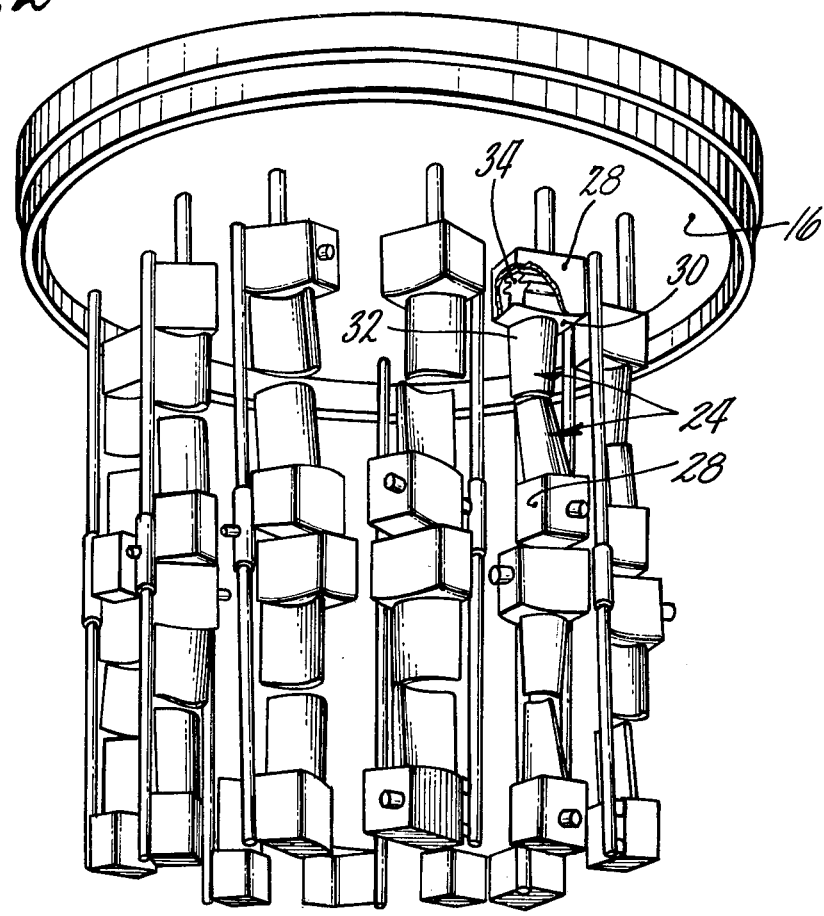
FIG. 2 is a perspective view of a multiplicity of rotor blades as supported in accordance with the concepts of the present invention.

Apparatus of the present invention is illustrated in the FIG. 2 perspective view showing a multiplicity of the substrate articles 24 suspended from the anode plate 16. The workpieces shown are rotor blades of the type utilized in gas turbine engines. The concepts are equally applicable to stator vanes. Each rotor blade has an airfoil section, a platform section and an attachment, or root section. Surfaces of the airfoil and platform sections are to be coated. Each rotor blade is supported within a boxlike structure 28 having one (1) open side and five (5) closed sides. Each box-like structure circumscribes the platform 30 of the corresponding blade. The airfoil section 32 of the blade extends outwardly from the box. The root section 34 of the blade is trapped within the box and is shielded thereby.

Four (4) such boxes are shown disposed along the axial length of a second, rod-like member 36. The first rod-like member 26 extends upwardly from the top box 28. The entire assembly is rotatable within the cathode sputtering device about the axis A of the first, rod-like member 26. Each of the boxes along the rod 36 is oriented such that the airfoil section of each component held thereby is mounted ninety degrees (90°) rotated from the airfoil sections of the adjacent components. Collaterally, the stacking lines of the airfoil sections are oriented coincidently with the axis of rotation A.

Figure 3A:
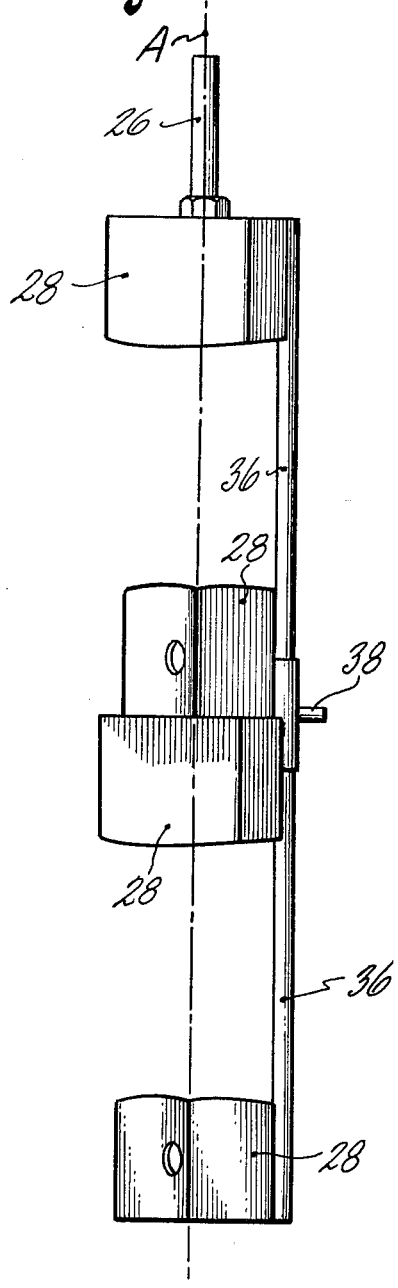
FIG. 3A is a simplified illustration of detailed apparatus of the present invention in the coating position with the axes of the rotor blades in substantial alignment.
Figure 3B:
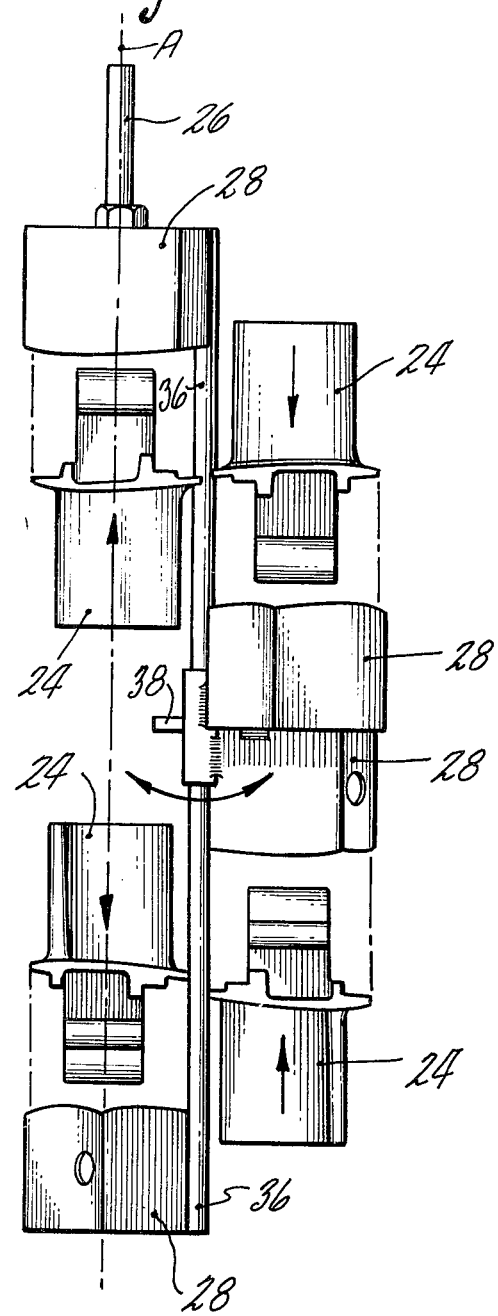
FIG. 3B is a view corresponding to the FIG. 3A view showing two of the box-like support members rotated to the blade assembly position.

At least one of the boxes disposed intermediately along the rod is rotatable about the rod to enable close assembly of the rotor blades into the boxes. The FIG. 3A view shows the boxes rotated into the coating position. The boxes are secured in the coating position by a pin type, locking member 38. The FIG. 3B view shows the boxes rotated into the assembly position.

Figure 4:
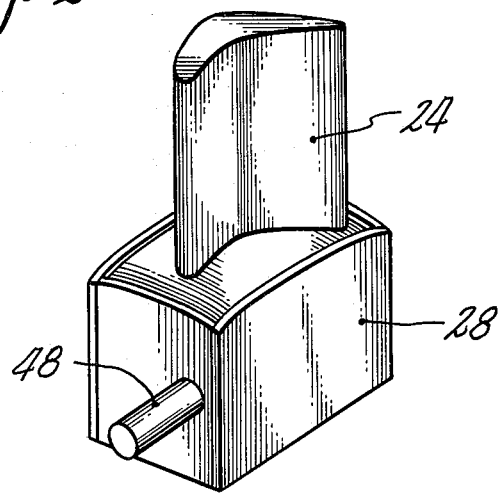
FIG. 4 is a perspective view of a rotor blade assembled in support apparatus of the present invention.

Several forms of the box-like structure may be employed. As is illustrated in FIG. 4, the box-like structure circumscribes the platform section 30 of the rotor blade. The box-like structure extends around the periphery of the blade platform to a height H above the surface of the platform surface to be coated and is spaced apart a distance D from the sides of the platform.

Figure 5:
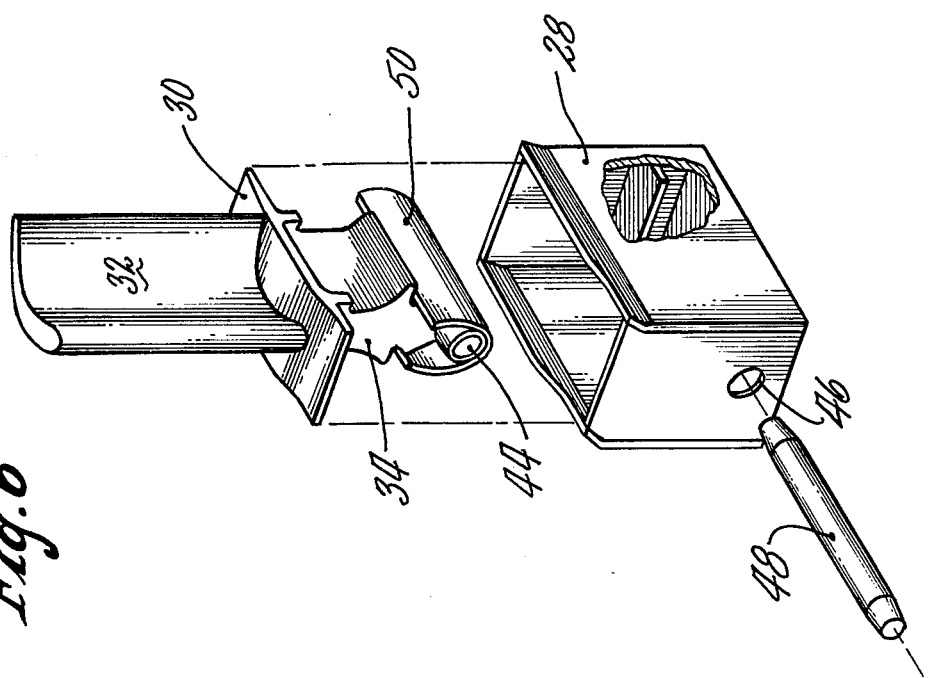
FIG. 5 is an exploded view of one detailed form of the present invention.
Figure 6:
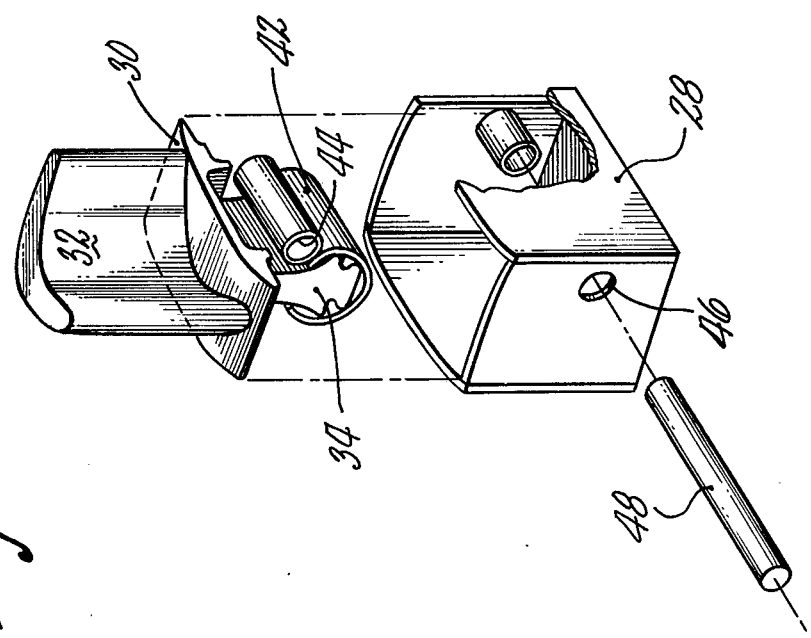
FIG. 6 is an exploded view of a second detailed form of the present invention.

FIG. 5 is an exploded view of one detailed concept of the present invention. A clip 42 having an open ended tubular portion 44 engages the root section of the rotor blade to be coated. The clip and root section are insertable through the open end of the box-like structure. The box-like structure has an aperture 46 through which a pin 48 is insertable to engage the tubular portion of the clip. A differing form of the clip 50 is illustrated in the FIG. 6 exploded view. Other forms and details of clip design may be employed within the concepts of the present teaching.

A principal benefit of the box-like structure for supporting the rotor blade in the cathode sputtering apparatus is the ability of the box-like structure to shield or mask the root section of the blade to be coated from coating material within the chamber. The rotor blades can be both easily assembled into the box-like structures.

In a further aspect of the invention, adherence of the blade platform to the box-like structure as a result of coating material deposition can be avoided by spacing the walls of the box-like structure apart a distance D of approximately fifteen thousandths of an inch (0.015 in.) from the edges of the platform. Additionally, it has been determined that the deposition of coating material on the edges of the platform can be avoided by extending the sides of the box-like structure to a height H of approximately forthy thousandths of an inch (0.040 in.) above the platform.

The boxes themselves are fabricated from alloys having proven resistance to acid stripping such that coating material deposited thereon can be readily stripped from these parts. The stripped parts are reusable. Alloys suitable for use with NiCoCrAlY type coating systems include nickel base and cobalt base superalloy systems such as Inconel 600 and Inconel 625, nickel base superalloys and HA 188, a cobalt base superalloy. Compositions of these two alloys are set forth below.

| | Composition (wt %) | | | | | | | | |
|---|---|---|---|---|---|---|---|---|---|
| | Ni | Co | Cr | C | Fe | W | Cb + Ta | La | Mo |
| Inconel 600 | Bal | — | 15.5 | 0.15 | 8.0 | — | 2.3 | — | |
| HA 188 | 22.0 | Bal | 22.0 | 0 | | 14.5 | — | 0.075 | |
| Inconel 625 | Bal | — | 21.5 | — | — | — | 3.65 | — | 9 |

Although the invention has been shown and described with respect to detailed embodiments thereof, it should be understood by those skilled in the art that various changes and omissions in form and detail may be made therein without departing from the spirit and the scope of the invention.

We claim:

1. Apparatus for supporting within a cathode sputtering device a workpiece having an attachment section, a platform section and an airfoil section and for shielding the attachment section of the workpiece from coating material to be deposited on airfoil and platform surfaces of the workpiece during a sputtering process, the apparatus comprising:

a clip which is adapted to engage the attachment section of the workpiece to be supported and which has an open ended tube;

a box-like member having one open side into which the attachment section of a workpiece engaged by one of said clips is insertable and having five closed sides; and a pin which is at least partially insertable into said tube of the clip through one of the closed sides of said box to hold the workpiece in the box-like member wherein said box-like member is adapted to circumscribe the periphery of the platform of the workpiece to shield the attachment section of the workpiece from coating material to be applied within the cathode sputtering apparatus.

2. The apparatus according to claim 1 wherein the box-like member is adapted to extend around the periphery of the workpiece platform to a height (H) above the platform of approximately forty thousandths of an inch (0.040 inches).

3. The apparatus according to claim 1 or 2 wherein the box-like member is sized to be spaced approximately fifteen thousandths of an inch (0.015 inches) from the platform of the workpiece to be held therein.

4. Apparatus for supporting a multiplicity of substrate articles in a cathode sputtering device wherein the substrate articles are characterized by an airfoil section, platform section, and attachment section including airfoil and platform surfaces to which the deposition of a coating material is desired, the apparatus comprising:

an elongated rod having a plurality of box-like members disposed along the length thereof, each of said box-like members having one open side into which the attachment section of a substrate article to be coated is insertable such that the box-like member circumscribes the periphery of the article platform section wherein at least one of said plurality of boxes disposed intermediately along the rod is rotatable about the rod to provide access to adjacent boxes for the assembly of workpieces therein.

5. The apparatus according to claim 4 which includes four (4) such box-like members mounted along the elongated rod and wherein the intermediate two (2) of such box-like members are rotatable about the rod for assembly of the workpieces into the box-like members.

* * * * *